United States Patent
Wang et al.

(10) Patent No.: US 7,332,407 B2
(45) Date of Patent: Feb. 19, 2008

(54) METHOD AND APPARATUS FOR A SEMICONDUCTOR DEVICE WITH A HIGH-K GATE DIELECTRIC

(75) Inventors: Chih-Hao Wang, Hsin-Chu (TW); Ching-Wei Tsai, Taoyuan (TW); Shang-Chih Chen, Jiadong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/788,229

(22) Filed: Apr. 19, 2007

(65) Prior Publication Data
US 2007/0187725 A1 Aug. 16, 2007

Related U.S. Application Data

(63) Continuation of application No. 11/021,269, filed on Dec. 23, 2004, now Pat. No. 7,229,893.

(51) Int. Cl.
*H01L 21/76* (2006.01)

(52) U.S. Cl. ............... 438/424; 257/E21.546; 257/510; 257/513

(58) Field of Classification Search ............... 438/424; 257/510, 513, E21.546
See application file for complete search history.

(56) References Cited

U.S. PATENT DOCUMENTS

| | | | |
|---|---|---|---|
| 6,063,698 A | 5/2000 | Tseng et al. | |
| 6,136,654 A | 10/2000 | Kraft et al. | |
| 6,174,775 B1 | 1/2001 | Liaw | |
| 6,232,163 B1 | 5/2001 | Voldman et al. | |
| 6,297,103 B1 | 10/2001 | Ahn et al. | |
| 6,352,885 B1 * | 3/2002 | Wieczorek et al. | ......... 438/197 |
| 6,359,311 B1 | 3/2002 | Colinge et al. | |
| 6,479,403 B1 | 11/2002 | Tsei et al. | |
| 6,566,205 B1 | 5/2003 | Yu et al. | |
| 6,596,599 B1 | 7/2003 | Guo | |
| 6,614,067 B2 | 9/2003 | Liaw | |
| 6,632,714 B2 | 10/2003 | Yoshikawa | |

(Continued)

OTHER PUBLICATIONS

Sekine, K., et al., "Nitrogen Profile Control by Plasma Nitridation Technique for Poly-Si Gate HfSiON CMOSFET with Excellent Interface Property and Ultra-low Leakage Current," IEEE, 2003, pp. 103-106.

(Continued)

*Primary Examiner*—Bradley K. Smith
(74) *Attorney, Agent, or Firm*—Slater & Matsil, L.L.P.

(57) ABSTRACT

A process and apparatus for a high-k gate dielectric MOS transistor is described. A substrate is provided, a high-k gate dielectric material is deposited over the substrate, a gate electrode layer is deposited over the dielectric material and a patterning step is performed creating sidewalls of the electrode and dielectric and removing a portion of the substrate. Sidewall material is deposited over the patterned gate electrode and dielectric creating protective sidewalls on the patterned gate electrode and dielectric that extend beneath the bottom of the dielectric. In alternative embodiments a channel material is deposited beneath the high-k gate dielectric and the patterning step removes at least a portion of the channel material beneath the high-k gate dielectric. In alternative embodiments the channel material is counter-doped.

20 Claims, 9 Drawing Sheets

U.S. PATENT DOCUMENTS

| | | | |
|---|---|---|---|
| 6,706,581 | B1 | 3/2004 | Hou et al. |
| 6,716,695 | B1 | 4/2004 | Hattangady et al. |
| 6,720,221 | B1 | 4/2004 | Ahn et al. |
| 6,743,704 | B2 | 6/2004 | Takahashi |
| 6,746,900 | B1 | 6/2004 | Lin et al. |
| 7,002,214 | B1* | 2/2006 | Boyd et al. ............... 257/351 |
| 2002/0168826 | A1 | 11/2002 | Jin et al. |
| 2003/0042548 | A1 | 3/2003 | Maeda et al. |
| 2003/0211680 | A1 | 11/2003 | Arghavani et al. |
| 2004/0026687 | A1 | 2/2004 | Grupp et al. |
| 2004/0033678 | A1 | 2/2004 | Arghavani et al. |
| 2004/0082125 | A1 | 4/2004 | Hou et al. |
| 2004/0087075 | A1 | 5/2004 | Wang et al. |
| 2004/0106287 | A1 | 6/2004 | Chau et al. |
| 2004/0110361 | A1 | 6/2004 | Parker et al. |
| 2004/0121541 | A1 | 6/2004 | Doczy et al. |
| 2004/0124476 | A1 | 7/2004 | Miyano |
| 2004/0142524 | A1 | 7/2004 | Grupp et al. |
| 2004/0164318 | A1 | 8/2004 | Lee et al. |
| 2005/0136584 | A1 | 6/2005 | Boyanov et al. |
| 2005/0269650 | A1* | 12/2005 | Pidin ...................... 257/411 |
| 2006/0081875 | A1* | 4/2006 | Lin et al. ................ 257/190 |

OTHER PUBLICATIONS

Iwamoto, T., et al., "A Highly Manufacturable Low Power and High Speed HfSiO CMOS FET with Dual Poly-Si Gate Electrodes," IEEE, 2003, pp. 1-4.

Shi, Z., et al., "Mobility Enhancement in Surface Channel SiGe PMOSFETs With $HfO_2$ Gate Dielectrics," IEEE Electron Device Letters, vol. 24, No. 1, Jan. 2003, pp. 34-36.

Tamura, Y., et al., "SiN-capped HfSiON Gate Stacks with Improved Bias Temperature Instabilities for 65 nm-node Low-Standby-Power Transistors," 2004 Symposium on VLSI Technology Digest of Technical Papers, IEEE, 2004, pp. 210-211.

Hu, C., "Device Challenges and Opportunities," 2004 Symposium on VLSI Technology, Digest of Technical Papers, IEEE, pp. 4-5.

Fung, S. K. H., et al., "65nm CMOS High Speed, General Purpose and Low Power Transistor Technology for High Volume Foundry Application," 2004 Symposium on VLSI Technology, Digest of Technical Papers, IEEE, pp. 92-93.

Yang, C. W., et al., "Effect of polycrystalline-silicon gate types on the opposite flatband voltage shift in n-type and p-type metal-oxide-semiconductor field-effect transistors for high-k-$HfO_2$ dielectric," Applied Physics Letters, vol. 83, No. 2, Jul. 14, 2003, American Institute of Physics, pp. 308-310.

Diaz, C. H., "Bulk CMOS Technology for SOC," Extended Abstracts of International Workshop on Junction Technology 2002, Japan Society of Applied Physics, pp. 91-96.

Ma, T. P., "Making Silicon Nitride Film a Viable Gate Dielectric," IEEE Transactions of Electron Devices, vol. 45, No. 3, Mar. 1998, pp. 680-690.

Shiraishi, K., et al., "Physics in Fermi Level Pinning at the PolySi/Hf-based High-k Oxide Interface," 2004 Symposium on VLSI Technology, Digest of Technical Papers, pp. 108-109.

Cartier, E., et al., "Systematic study of pFET $V_t$ with Hf-based gate stacks with poly-Si and FUSI gates," 2004 Symposium on VLSI Technology, Digest of Technical Papers, pp. 44-45.

Shima, M., "<100> Strained-SiGe-Channel p-MOSFET with Enhanced Hole Mobility and Lower Parasitic Resistance," Jun. 2003, Fujitsu Sci. Tech. J., vol. 39, 1, pp. 78-83.

Fernandez, F. A., et al., "Properties of $Si_3N_4/Si_xGe_{1-x}$ Metal-Insulator-Semiconductor Capacitors," Electronics Letters, Sep. 26, 1991, vol. 27, No. 20, pp. 1826-1827.

Yeo, Y-C., et al., "Enhanced Performance in Sub-100 nm CMOSFETs using Strained Epitaxial Silicon-Geranium," IEDM 2000, pp. 753-756.

Lu, W., et al., "p-Type SiGe Transistors with Low Gate Leakage Using SiN Gate Dielectric," IEEE Electron Device Letters, vol. 20, No. 10, Oct. 1999, pp. 514-516.

She, M., et al., "JVD Silicon Nitride as Tunnel Dielectric in p-Channel Flash Memory," IEEE Electron Device Letters, vol. 23, No. 2, Feb. 2002, pp. 91-93.

Khare, M., et al., "Highly Robust Ultra-Thin Dielectric for Giga Scale Technology," 1998 Symposium on VLSI Technology Digest of Technical Papers, pp. 218-219.

Wang, D., et al., "High-Quality MNS Capacitors Prepared by Jet Vapor Deposition at Room Temperature," IEEE Electron Device Letters, vol. 13, No. 9, Sep. 1992, pp. 482-484.

Weber, O., et al., "55 nm high mobility SiGe(:C) pMOSFETs with $HfO_2$ gate dielectric and TiN metal gate for advanced CMOS," 2004 Symposium on VLSI Technology, Digest of Technical Papers, IEEE 2004, pp. 42-43.

Tseng, H.-H., et al., "Ultra-Thin Decoupled Plasma Nitridation (DPN) Oxynitride Gate Dielectric for 80-nm Advanced Technology," IEEE Electron Device Letters, vol. 23, No. 12, Dec. 2002, pp. 704-706.

Tseng, H.-H., et al., "Threshold Voltage Instability and Plasma Induced Damage of PolySi/HfO2 Devices—Positive Impact of Deuterium Incorporation," 2004 IEEE International Conference on Integrated Circuit Design and Technology, pp. 255-259.

* cited by examiner

METHOD AND APPARATUS FOR A SEMICONDUCTOR DEVICE WITH A HIGH-K GATE DIELECTRIC

CROSS-REFERENCE TO RELATED APPLICATIONS

This application is related to co-pending and commonly assigned U.S. application Ser. No. 11/185,443, filed Jul. 20, 2005, which application is incorporated herein by reference.

This application is a continuation application of U.S. application Ser. No. 11/021,269, filed on Dec. 23, 2004 now U.S. Pat. No. 7,229,893, entitled "Method and Apparatus for a Semiconductor Device with a High-k Gate Dielectric," which application is hereby incorporated herein by reference.

TECHNICAL FIELD

The present invention and the various embodiments described generally relate to the fabrication of semiconductor devices, and more particularly to fabricating integrated devices which incorporate at least one planar MOS transistor having a high-k gate dielectric.

BACKGROUND

In the semiconductor art, it is desirable to improve transistor performance even as devices become smaller due to ongoing scaling. Reduced device scaling with conventional gate dielectrics creates problems in manufacturing reliable MOS transistors, including short channel effects (SCE) and gate dielectric leakage. It is known in the prior art to use high-k dielectric materials as the gate dielectric material to improve device performance. For purposes of this description, a high-k dielectric is a material having a dielectric constant k greater than that silicon dioxide, the traditional dielectric material, which has a dielectric constant of approximately 3.9. Materials with a dielectric constant of greater than 3.9 are said to be "high-k" dielectrics. High-k dielectrics provide a similar equivalent oxide thickness (EOT) to smaller scaled devices while using a larger actual dielectric thickness, which meets the reduced scaling requirements of advanced CMOS processes. The use of such materials creates additional problems, however, in the manufacturing and reliability of the transistor devices, including a threshold voltage (Vt) variability in the MOS transistors, particularly of p-type MOS transistors, which makes commercial devices using the high-k dielectric materials less desirable. Further, reduction in scale and the use of certain desirable high-k dielectric materials on silicon substrates are believed to contribute to a reported degradation in carrier mobility, which has a negative effect on the performance of transistors, manufactured using these materials.

A paper entitled "A Highly Manufacturable Low Power and High Speed HfSiO CMOS FET with Dual Poly-Si Gate Electrodes," Iwamoto et al., International Electronics Devices Meeting of the IEEE (IEDM), December 2003 describes a MOSFET of the p-type which uses a particular high-k gate dielectric material, HfSiO, over a silicon substrate, and describes the use of certain sidewalls and a channel controlling step to improve the Vt variability effects. This paper describes the threshold voltage shift problem particularly observed in p-type MOS transistors that are fabricated using high-k dielectric materials.

A paper entitled "55 nm high mobility SiGe(:C) PMOS-FETS with $HfO_2$ gate dielectric and TiN metal gate for advanced CMOS," by Weber et al., 2004 Symposium on VLSI Technology, Digest of Technical Papers, describes the improved transistor performance obtained for a PMOS transistor fabricated using a SiGe channel material grown by epitaxial deposition of a compressively strained SiGe layer, with a high-k gate dielectric of HfO2, and a metal gate electrode of TiN, having improved carrier mobility and improved Vt.

A paper entitled "Mobility Enhancement in Surface Channel SiGe PMOSFETs with HfO2 Gate Dielectrics," by Shi et al., IEEE Electron Device Letters, Vol. 24, No. 1, Jan. 2003, describes PMOS transistors fabricated using strained SiGe as the channel layer and HfO2 as the dielectric, the paper describes enhanced mobility for the devices over conventional silicon devices but also describes a variance in the threshold voltages.

A paper entitled "<100> Strained SiGe Channel PMOSFET with Enhanced Hole Mobility and Lower Parasitic Resistance," by Shima, Fujitsu Science and Technology Journal 39, vol. 1, pp. 78-83 (June 2003), describes results obtained in carrier mobility experiments with strained SiGe as a channel material in PMOS devices.

The need for a process and apparatus for a producible, enhanced performance, scalable MOS transistor with a high-k gate dielectric thus exists. These needs are addressed in the present invention.

SUMMARY OF THE INVENTION

Various embodiments of the present invention provide a novel process and structure for a planar MOS transistor using a high-k gate dielectric material. In a first preferred embodiment of the structure of the invention, a high-k dielectric is provided over a substrate, a gate electrode material is deposited over the high-k dielectric, a protective mask is deposited over the electrode, this mask is patterned, and the gate electrode and gate dielectric structure are subsequently completed by an anisotropic etch which extends through the dielectric layer and into the underlying substrate material beneath the bottom of the dielectric material. The resulting structure is then processed further to include sidewall spacers and self-aligned source and drain regions to form complete MOS transistors, the sidewall spacers covering the sides of the gate electrodes including the portion of the area beneath the bottom of the dielectric layer. Because the sidewall covering extends beneath the channel dielectric interface area, the possibility is reduced that undesirable intrusion of material, including oxygen or hydrogen atoms, will infiltrate any of the channel region, the interface between the substrate channel and the dielectric, the dielectric, or the interface between the dielectric material and the gate electrode material. The high-k dielectric in the resulting MOS transistor devices thus remains its electrical property with desirable dielectric constant (k).

In a preferred embodiment, a counter-doped channel is created in the substrate in the regions where the transistors will be formed by using conventional ion implantation into the substrate. The counter-doped channel increases performance and adds additional advantages such as allowing the adjustment of voltage thresholds, Vt, for the completed transistors.

In a preferred embodiment, a channel material of, for example, strained silicon (Si) or strained silicon germanium (SiGe) or their combination is deposited beneath the dielectric material to provide the channel for the resulting devices and to increase the carrier mobility with reduced threshold voltage; optionally this channel material may be counter-doped to further provide enhanced transistor performance. Again the sidewall spacers extend into this layer and extend beneath the bottom of the high-k dielectric layer to prevent undesirable impurities, including oxygen or hydrogen atoms, from infiltrating the structure and from degrading the high-k dielectric.

In another preferred embodiment, the high-k dielectric has a dielectric constant k over at least about 8 or greater, and may include hafnium (Hf) and silicon (Si). Nitrides and high-k dielectric stacks may be used as the dielectric including Hf, Si, O and N. Tantalum (Ta) or lanthanum (La) oxides, aluminum oxide and/or nitrides, combination or stacked dielectrics and other known high-k dielectrics may be used.

In another preferred embodiment, an integrated circuit having both core and peripheral areas may be defined on a substrate. The processing steps in the core and peripheral areas may be asymmetric, that is photomasks and photolithographic techniques may be used to provide a patterned resist coating in one of the two areas, protecting this area while a processing step is performed in the other area, and vice versa. Using this asymmetric approach to device processing, a layer of strained SiGe may be deposited in the core device area only, while it is not provided in the peripheral device area. High-k dielectric may then be deposited in both areas and gate electrode material may be deposited in both areas, however in the peripheral area the gate dielectric thickness may be greater than in the core area.

In another preferred embodiment, the strained channel layer may be counter-doped to enhance transistor performance and provide further Vt control. Using photomasks to form resist, some or all of the transistors may be subjected to the counter-doping, or some may not be counter-doped.

In another preferred embodiment, the devices may be fabricated over an insulator in a silicon-on-insulator (SOI) structure. The substrate material may be bulk silicon and may include n and p-type doped well areas, alternatively the substrate may comprise SiGe, Ge, strained Si, strained Ge or a combination or stacked arrangement of Si/SiGe layers.

In another preferred embodiment, a metal gate electrode or a combination material including a metal may be used for the gate electrode, for example a TiN (Titanium Nitride) metal gate electrode may be used. Polysilicon, and doped polysilicon, may be used for the gate electrode, the polysilicon gate electrodes may incorporate an additional salicide coating for better performance.

In another preferred embodiment, the channel material is deposited over the substrate, a gate dielectric and gate electrode material is provided over the substrate and the channel material, a photomask patterning and etch is performed to form the gate electrodes and dielectrics having sidewalls extending into the channel material, sidewall spacers are formed on the sidewalls of the gate electrodes and dielectrics and extending beneath the bottom of the gate dielectric material, and a subsequent etch is performed to remove any of the remaining channel material completely outside of those areas under the completed gate electrodes to reveal the silicon or other substrate prior to subsequent processing. Again the sidewall oxides extend to a depth beneath the gate dielectric and protect the strained channel material from undesirable infiltrations of materials including oxygen (O) and hydrogen (H), which might otherwise form unwanted compounds including oxides in the counter-doping channel material and relax the strained material, reducing its effectiveness.

Applications for the high-k gate dielectric transistors of the invention include CMOS logic transistor arrays including n and p well areas, the counter-doping channel material, and the high-k gate dielectric, thereby forming nMOS and pMOS transistors with counter-doped channels of different dopants, in some embodiments the core logic area may include the counter-doped channels while the peripheral area may include larger transistors formed without the counter-doped channels. Memory integrated circuits may also be fabricated using the high-k gate dielectrics of the invention and the counter-doped channels in the core area while the peripheral circuitry includes the high-k gate dielectric material but does not include the counter-doped channel material.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Figure 1:
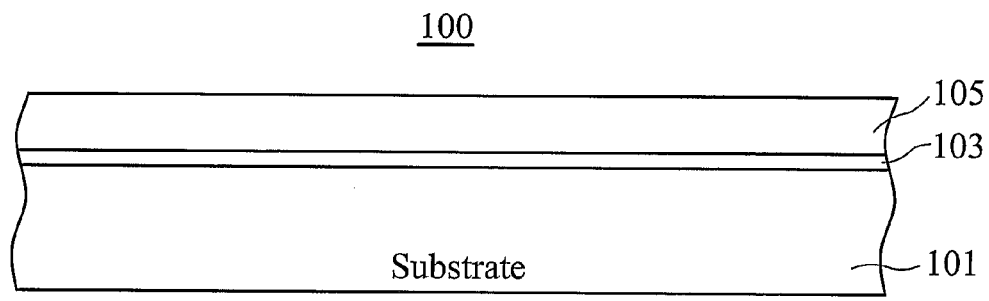
FIG. 1 depicts a cross-sectional view of a substrate prior to isolation trench formation including a deposited oxide and a deposited nitride layer.

FIG. 1 depicts a cross sectional view of an integrated circuit 100 not drawn to scale, but drawn as an illustration only. Semiconductor substrate 101 will provide the basic material for the manufacture of the circuit. Substrate 101 is shown with a pad oxide layer 103 and a nitride layer 105 deposited over it using typical deposition processes, for example the depositions may be a chemical vapor deposition, a plasma enhanced deposition, or any other blanket deposition known in the art, such as reduced pressure CVD or others. The nitride layer 105 can be formed by LPCVD with a resulting thickness of around 500 A~2000 A.

Figure 2:
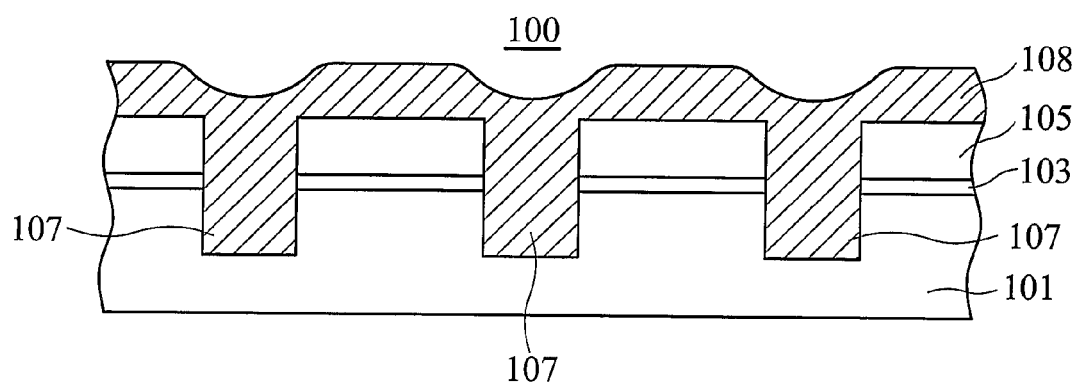
FIG. 2 depicts a cross-sectional view of the substrate following the trench isolation formation and oxide deposition.

FIG. 2 depicts the device 100 after the nitride 105 and pad oxide 103 are patterned and etched using photolithography techniques to form a hardmask, then an etch is performed and the hardmask is removed, the etch may be for example an HF or piranha etch, the STI oxide 108 is then conformally deposited. The trenches may be about 1000-5000 Angstroms deep or more or less, in an example the completed STI trenches were 2000 Angstroms deep. Oxide 108 may be deposited using high density plasma (HDP) or other techniques, for example TEOS may be used STI oxide may be formed by HDP with a thickness sufficient to fill and completely cover the entire trench, for example it may result in a thickness greater than 5000 A.

Figure 3:
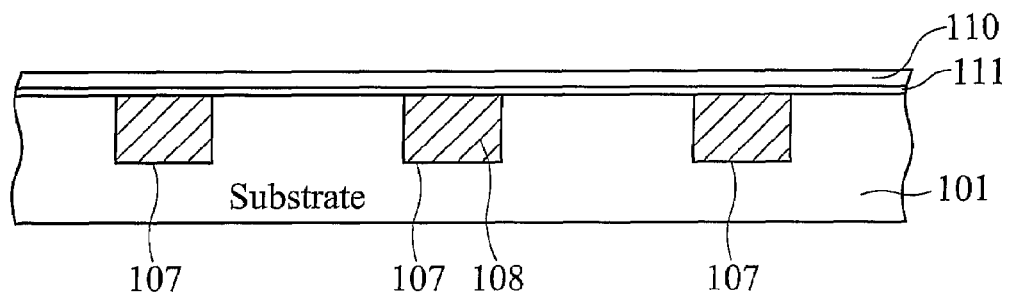
FIG. 3 depicts a cross-sectional view of the substrate following the trench isolation formation and subsequent planarization and following deposition of the high-k gate dielectric.

FIG. 3 depicts the device 100 following the removal of the excess trench oxide, the nitride layer and the pad oxide layers 103, 105 and the deposition of a gate dielectric layer 110. In the removal steps, CMP (chemical mechanical polishing) processes are used to chemically and mechanically remove the trench oxide, nitride and pad oxide layers to complete the oxide filled shallow trench isolation regions 107 which extend to, or even above, the surface of the substrate. Following the CMP and a clean up step, in a first preferred embodiment of the method of the invention, a thin interfacial layer (oxide, trap-free nitride or nitrided oxide) 111 is formed directly onto the substrate 101 and the STI regions 107, then a high-k gate dielectric 110 is deposited onto the interfacial layer 111.

Deposition of the dielectric material may be performed by any known method including remote plasma CVD (RPCVD), plasma enhanced CVD (PECVD), atomic layer deposition (ALD) MOCVD, PVD, sputtering or other methods known in the art. High-k dielectrics are those dielectrics, which have a dielectric constant k of greater than about 3.9, the dielectric constant for typical conventional silicon dioxide dielectric, and possible high-k dielectrics include silicon nitride, tantalum pentoxide, hafnium oxide, hafnium silicon oxynitride, lanthanum oxides, and other high-k dielectric materials known in the art. A range of dielectric constant materials is known, for example for the range of $3.9<k<9$, the high-k gate dielectric may include oxy-nitride, oxygen containing dielectrics, nitrogen containing dielectrics, combinations of these and multiple layers of these. For $k>8.0$, the dielectrics may include any of $HfO_2$, $HfSiOx$, $HfSiON$, zirconium such as $ZrO_2$, aluminum such as $Al_2O_3$, titanium such as $TiO_2$, tantalum pentoxide, lanthanum oxide such as $La_2O_3$, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these. An amorphous high-k dielectric is a preferred embodiment that may be used, preferably the amorphous material comprises at least 50% of the dielectric and has no grain boundary and is not grain sized. Low thermal processes are required to maintain the amorphous material in the dielectric; typically the processes must remain at<1100 degrees Celsius. The amorphous region is formed by incorporating material such as Si, Ge, F, N, C, B, O, Al, Ti, Ta, La ,Ce, Bi, W, Y, Ba, Sr, and Pb into the dielectric materials. Before the high-k deposition, a thin interfacial layer is deposited; this layer is required to maintain electron/hole mobility. The process and clean up steps are similar to those steps used with conventional gate oxide growth (including oxide, nitrided oxide, trap-free nitride). Then, high-k deposition is performed by the following process steps. Deposition is performed and may be performed by ALD or MOCVD with low pressure and low temperature (<500C.). Finally, treatment by thermal or plasma is performed to maintain the amorphous structure in the high-k dielectric. The dielectric layer thus produced is typically fairly thin, for example 1-100 Angstroms. In one preferred embodiment example a high-k dielectric layer of HfSiON was deposited to about 40 Angstroms thickness and having an equivalent oxide thickness (EOT) of less than about 2.0 nanometers.

Figure 4:
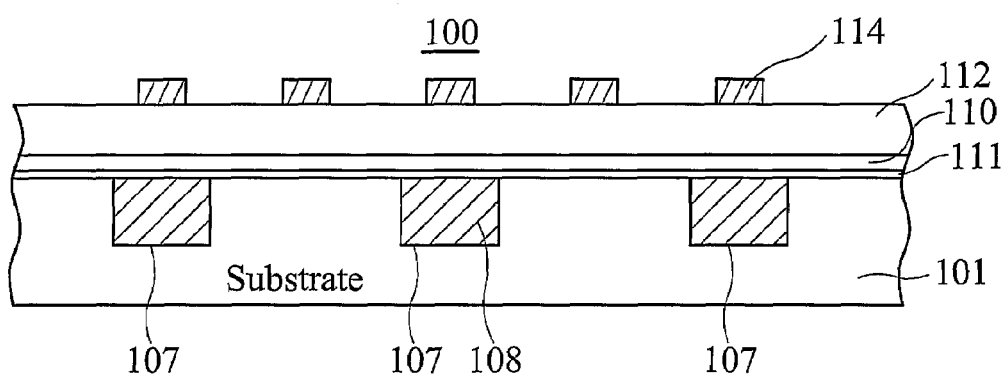
FIG. 4 depicts the substrate following deposition of a gate electrode material over the high-k gate dielectric and following the formation of a pattern mask material.

FIG. 4 depicts the device 100 following the deposition of the gate electrode material 112 over the high-k gate dielectric and the formation of a patterned mask 114 for use in etching the gate electrodes. The gate electrode material 112 may be of polysilicon, doped polysilicon, metal compositions such as titanium nitride (TiN), silicides, or other metal gate electrode materials used in the art. A metal gate with a work function of greater than or equal to 4 may be used. In a preferred embodiment the gate material is a doped polysilicon gate electrode material deposited, for example, by a conventional CVD process to a thickness of about 1000 Angstroms and is conventionally doped in situ or implanted with an n-type dopant, such as antimony, phosphorous or arsenic, or doped or implanted with a p-type dopant such as boron, indium, or aluminum.

The patterned mask 114 defines areas for forming transistor gate electrodes over the substrate, and for areas for making connectivity at the polysilicon level over the STI regions 107. The formation of the gate electrode material 112 will not create an active device over the STI regions 107 (as there is no active silicon area for receiving subsequent source and drain diffusions) but instead provides additional connectivity areas to those portions of the gate electrodes, which may in fact overly other active areas in the substrate in regions that are not visible in the cross section of the figure.

Figure 5:
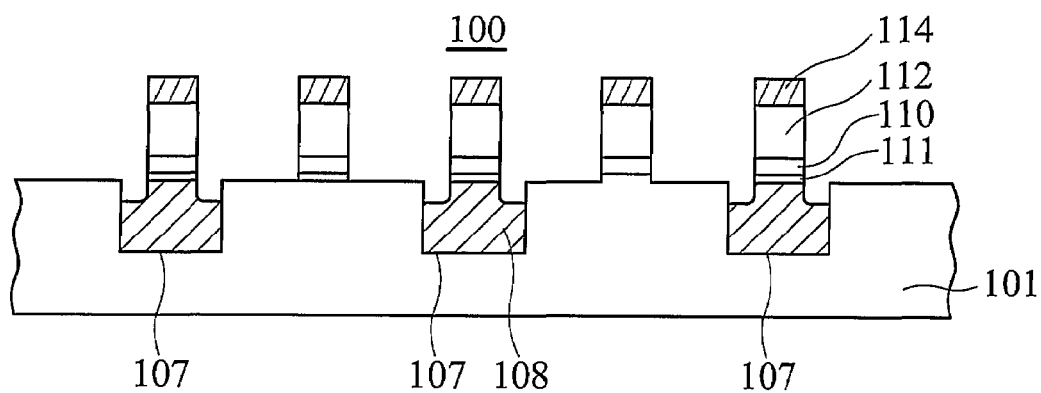
FIG. 5 depicts the substrate following the patterning of the gate electrode material by etching the gate electrode material and the high-k gate dielectric using the mask material.

FIG. 5 depicts the device 100 in the same cross sectional view as in the prior figures following an etch step which patterns the gate electrode material 112 and the high-k gate dielectric 110. Importantly, the etch is then allowed to continue into the substrate 101 and into the STI regions 107, to extend the etched region to a depth which lies below the bottom of the interfacial layer 111. In FIG. 5 the substrate 101 is shown removed to a depth below the bottom of the interfacial layer 111 by some amount, the etch used is also highly selective for the STI oxide 108 and removes significantly more of the STI oxide 108 than it does of the silicon substrate 101. This "overetch" or patterning beneath the bottom of the high-k gate dielectric layer 110 and the interfacial layer 111 is an important aspect of the invention, as it allows protective sidewalls to be formed (as will be further described below) that will prevent the intrusion of oxygen, hydrogen or other impurities into the high-k dielectric, into the interfaces between the dielectric and the substrate, or into the interface between the dielectric and the gate electrode. This is an important aspect of the invention as impurity intrusions and the resulting effects, especially undesired oxidation, are believed to contribute to the problems of the prior art MOS devices produced with high-k gate dielectrics.

Figure 6:
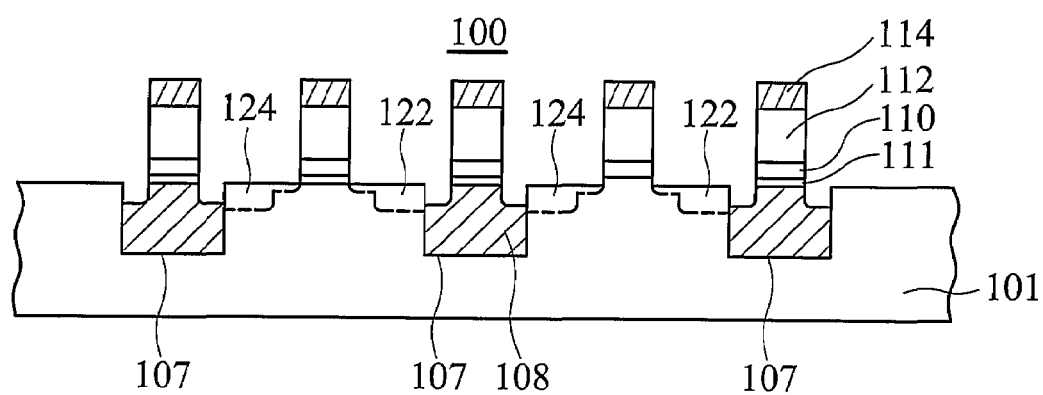
FIG. 6 depicts the substrate following the formation of the source and drain regions adjacent the gate regions.

FIG. 6 depicts the substrate 101 of the device 100 in accordance with a preferred embodiment of the present invention after lightly doped drain and source regions 122, 124 are formed, and pocket implants are performed to complete the drain and source regions which are self aligned to the gate regions. The gate electrode 112, gate dielectric 110, and the source and drain diffusions 124, 122 together form a planar MOS transistor. Depending on the type of dopants used in the source and drain and the substrate, the transistors may be of a p-type MOS transistor or an n-type MOS transistor. In complementary MOS transistor integrated circuit 100, the transistors may be formed in well diffusions (not shown) that were performed prior to the STI region formation described here, as is known in the art, the wells being isolated by the STI regions 107. Conventional ion implantation and thermal anneal processes are used to deposit and form the doped source and drain regions 124, 122. For source/drain implanting, P and As can be the doping species for N+S/D, $BF_2$, In, and B doping species can be used for P+S/D. The annealing temperature is preferably approximately 1000 degrees C. and is less than 1100 degrees C. Well diffusions can include well formation, anti-punch through and channel implant steps.

Figure 7:
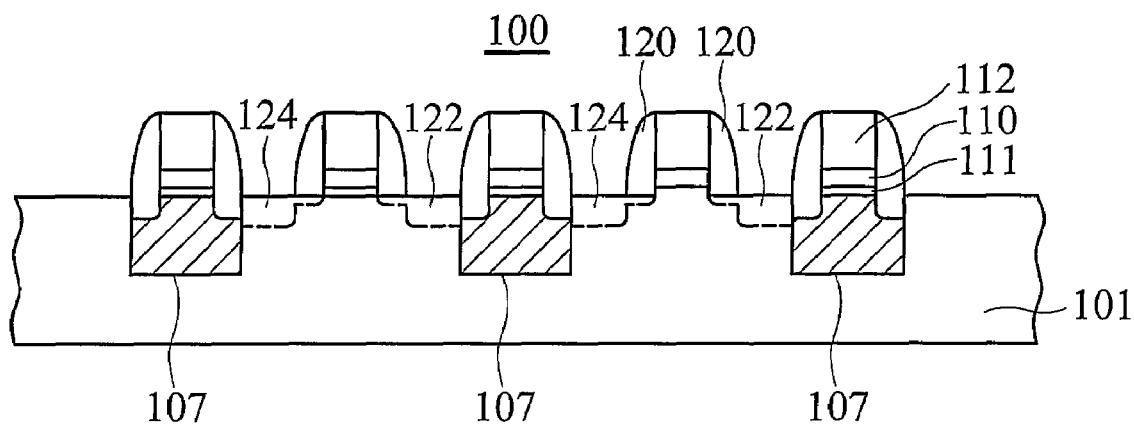
FIG. 7 depicts the substrate following the completion of transistors having source and drain regions aligned to the gate electrodes of FIG. 6 and showing the sidewall insulator material formed over the sidewalls of the gate electrodes and dielectric materials.

FIG. 7 depicts the substrate 101 following the formation of the sidewall spacers 120, source and drain diffusions 124 and 122 are formed in the substrate areas using ion implantation and thermal anneal procedures as are known in the conventional art. Sidewall spacer 120 is deposited using a non-high-k dielectric to provide a protective spacer over the sidewalls of the electrode and extending beneath the bottom of the high-k gate dielectric 110. The sidewall is preferably nitrogen containing oxide or silicon nitride material, and may be deposited by low temperature deposition techniques including PECVD and remote plasma (RPCVD). The sidewall spacers 120 may comprise silicon nitride ($Si_3N_4$) or silicon oxynitrides. In a preferred embodiment the oxide or nitride sidewall spacer may be 30~100 Angstroms wide. The preferred example is CVD nitride deposition with a process temperature that is greater than 500 degrees Celsius and approximately 1 minute deposition time.

Following the steps described so far to form the cross section shown in FIG. 7, the integrated circuit 100 is completed using conventional semiconductor processing steps as are known in the art; for example silicide may be formed by depositing a metal such as titanium or cobalt and then treated to form self-aligned silicide, or salicide, on top of the gate electrode 112, the source and drain regions 124, 122, and other areas to provide a lower resistance and improve device performance, however this step is optional. Following the salicide step, if used, interlevel insulation layers are formed above the substrate using deposition steps to deposit oxide, nitride or other conventional insulation layers, typically silicon dioxide is formed. Contact areas are patterned and etched into the insulators. to expose the source, drain and gate electrodes, the resulting vias are filled with conductive material to provide electrical connectivity from metallization layers above the interlevel insulating layers down to the gate electrodes, the source and the drain regions. Metallization layers of aluminum, or copper, may be formed over the interlevel insulation layers using known techniques such as an aluminum metallization process or a dual damascene copper metallization process to provide one, or several, wiring layers that may contact the vias and make electrical connections to the gate electrodes 112, the source and drain regions 124, 122. Conventional clean up, passivation, die saw, singulation, packaging, assembly and test steps are used to complete the integrated circuit devices formed on the substrate 101.

Figure 8A:
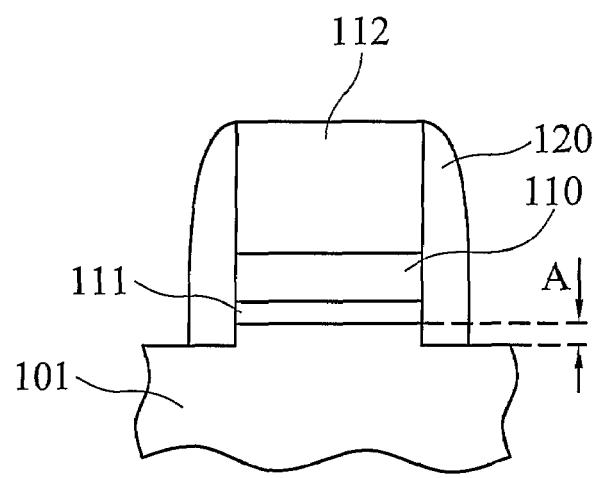
FIG. 8 depicts two cross-sectional views of regions of FIG. 7, 8A depicts a region where the gate electrode overlies the substrate and 8B depicts a region where the gate electrode overlies a shallow trench isolation region including an insulator.

FIG. 8A depicts a larger magnitude view of a cross section of a gate electrode 112 and gate dielectric layer 110 of the invention including the sidewall etch in a region over the substrate 101. Depth A in the figure indicates the depth of the electrode sidewall etch into the substrate, the etch of the electrodes to form the sidewalls is a typical dry etch or wet etch using typical etchants such as HF chemistry.

Figure 8B:
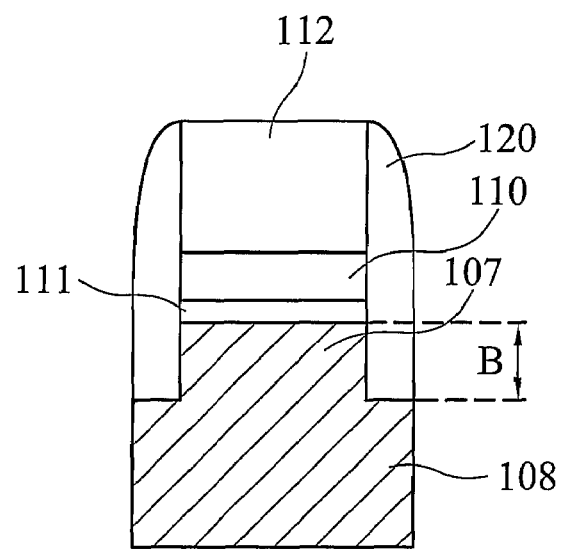

FIG. 8B depicts the same larger magnitude view of a cross section of a gate electrode 112, and gate dielectric layer 110, over a shallow trench 107. Depth B indicates the depth of the etch into the oxide 108 previously disposed in the shallow trench 107 as describe above. Whether the etch is performed as dry or wet process, the etch is very selective to the shallow trench isolation oxide 108 and thus the depth B is very much greater than the depth A. The depth A can be smaller than 4nm and the depth B can be smaller than 20 nanometers in a preferred embodiment. In a preferred embodiment the ratio of depth B/depth A is at least 3, or greater.

Figure 9:
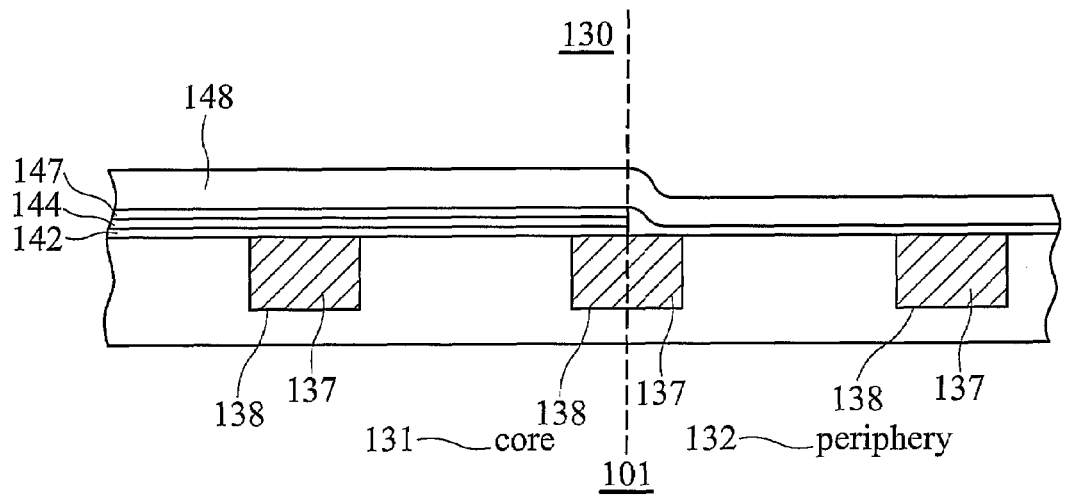
FIG. 9 depicts a cross section of a substrate illustrating the formation of another preferred embodiment of the present invention, wherein a channel material is formed over a portion of the substrate prior to the deposition of the gate dielectric layer.

It is known in the prior art that the use of reduced scale processes for manufacturing active MOS transistors using high-k gate dielectrics may require additional materials to increase performance. For example, it is known to use strained Si, Ge or SiGe channel material to increase the mobility of the carriers, which is particularly important in the production of p-type MOS transistors. FIG. 9 depicts a first step of a process for producing an integrated circuit 130 including devices of the invention incorporating a strained channel layer.

At the stage of processing depicted in cross section of FIG. 9, STI regions 137 separate certain regions of semiconductor substrate 101 that has been arranged into two areas, a core area 131 and a periphery area 132. A channel material 142 is shown deposited over the substrate in the core area but not in the periphery area. The channel material is not deposited over the STI regions 137. This channel material is for example a strained Si, Ge, strained Ge, or strained SiGe layer deposited over only the core area (using a protective mask formed over the periphery to perform asymmetric processing in the two areas, as is known in the art) by, for example, an epitaxial growth using in situ doping, the channel material 142 is formed very thin, and may be about 200 Angstroms or less in thickness, in a preferred embodiment the final thickness obtained is 100 Angstroms. The channel material may be any of several semiconductor materials, compound or multilayer materials may be used, including Si, strained Si, SOI, SiGe, SiGeOI, Ge, strained Ge, and combinations of these. In situ doping is used and typically a boron dopant is used to counter-dope the channel for a p-MOS transistor. Other dopants that can be used are Al, Ga, In for p-channels, and N, P, As, and Sb for n-channels. The channel region is also thin, in an example it was thinner than about 200 Angstroms. Alternatively ion implantation could be used to dope the channel region but this method is not as preferred; the epitaxial growth approach described here with the in situ doping may be referred to as a "predoped" layer.

Following the epitaxial growth of the channel material 142 in the core regions, a cap layer of Si 144 is preferably deposited over the channel material. This layer is used as a sacrificial layer to subsequently form a very thin SiO2 oxide, which may be about 10 Angstroms or more or less, in preference to the germanium oxide that would inevitably form during subsequent processing steps if the Si layer 144 were not present. This native germanium oxide is less desirable; a native oxide will always form on an exposed SiGe layer in subsequent steps, so the use of the silicon sacrificial layer 144 provides control over this thin native oxide.

Following the deposition of the channel (SiGe in this example) material 142, and the Si layer 144, an interfacial layer 147 is again required to maintain good carrier mobility and the high-k gate dielectric layer 148 is again deposited over the interfacial layer 147 as described above.

Note that at the transition from the core area 131 to the periphery 132, there is a small step down from the core area, which includes the strained layer, the silicon cap layer, which are not present in the peripheral area 132. The transition should not be large since the thickness difference is small, typically less than about 100 Angstroms.

Figure 10:
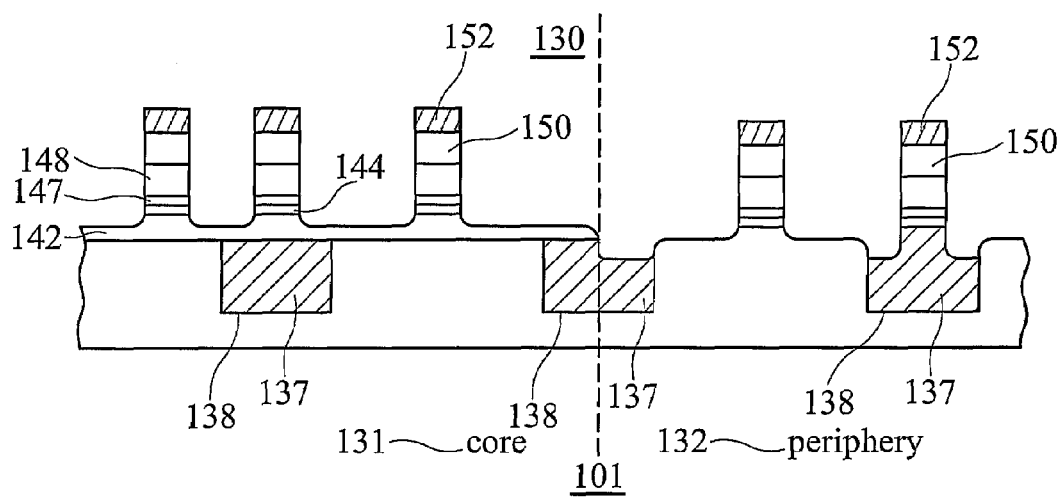
FIG. 10 depicts a cross sectional view of another step of processing the preferred embodiment of FIG. 9.

The remaining steps of processing for this embodiment of the invention are again as described above for the earlier embodiments of the invention. FIG. 10 depicts the integrated circuit 130 following the formation of a mask layer 152 over the gate electrode material 150 and the high-k gate dielectric 148 and the etch step to pattern and form the electrodes. Again the gate electrode etch used to pattern the gates is continued until the etch step extends into the channel material 142 in the core area 131 and into the STI oxide layer 108 in STI regions 107, or the substrate surface in the periphery areas 132.

Figure 11:
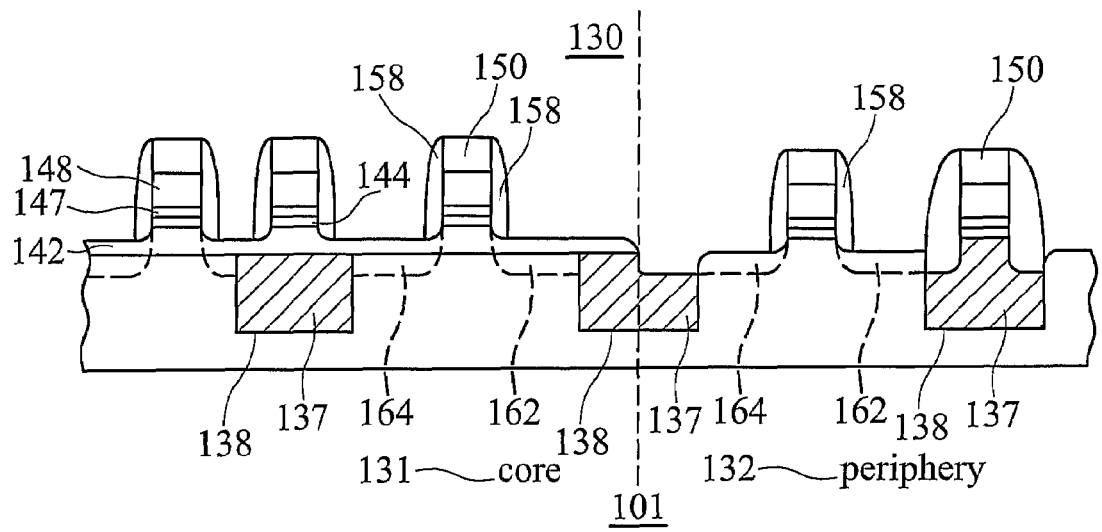
FIG. 11 depicts a final cross sectional view of the substrate of FIG. 9 following the completion of the transistors of the embodiment of FIG. 9 where some of the devices include a channel layer underneath the high-k gate dielectric.

FIG. 11 depicts the completed devices with source and drain regions 164 and 162 formed by conventional dopant implant and anneal steps as described above, pocket implants and lightly doped drain processing steps may be used as is known in the art. In a preferred embodiment, in the core region, the devices are smaller and have, for example, high-k gate dielectric that has equivalent oxide thicknesses (EOT) are less than about 2 nanometers; while in the periphery region, the devices have gate dielectrics with equivalent oxide thicknesses (EOT) that are greater than about 5.0 nanometers.

Figure 12:
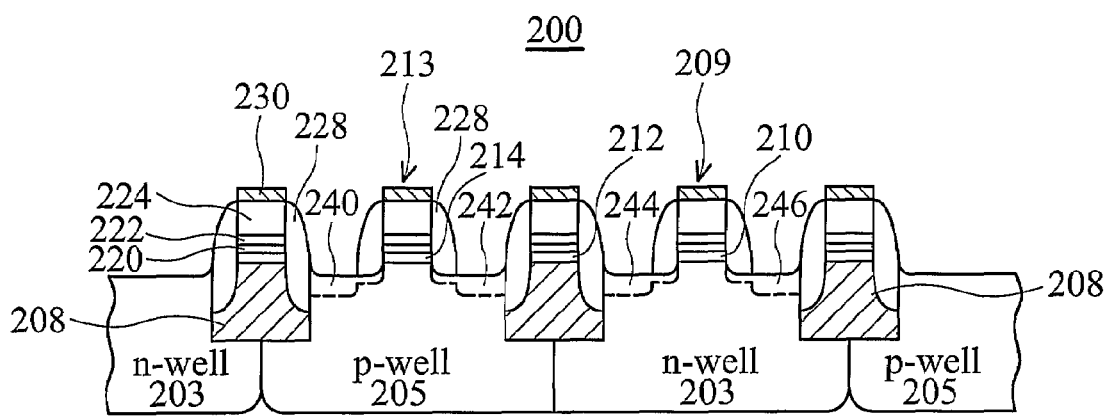
FIG. 12 depicts a cross sectional view of another preferred embodiment which illustrates the invention in a complementary or CMOS embodiment, with n and p well regions.

FIG. 12 depicts an alternative embodiment of the invention in a cross section. In FIG. 12, device 200 has complementary MOS transistors 209, 213 formed in a silicon substrate 201. Prior to the formation of and etch of the STI regions, the substrate is selectively implanted with p and n-type dopants to form n-wells 203 and p-wells 205, these implants are followed by a deep annealing step. RTA or rapid thermal anneal processes may be used. Alternatively, the well implants may be performed later in the process using known through-layer ion implant and anneal steps, for example after the channel and dielectric material are deposited.

High-density plasma STI oxides 208 are formed by deposition over the etched trench regions and CMP is used to complete the shallow trench isolations, as before. A layer of strained SiGe or strained Si is deposited, again as described above, by epitaxial growth. If counter-doping is to be performed, then the n and p-type MOS transistors 213 and 209 will be doped in different steps to provide the correct type of counter-dopant. Usually, counter-doping is performed right after well formation and before gate oxide formation. The doped channel material is shown as 214 for the n-type MOS transistor 213, and 210 for the p-type MOS transistor 209.

The next steps are as described above. If SiGe is used for the channel material, then a sacrificial silicon layer 220 is grown or deposited over it to prevent a germanium oxide from forming and to cause a preferred SiO2 native oxide to form the thin interfacial layer as described above. Following the deposition of the silicon layer 220 and the formation of the interfacial layer oxide, a high-k gate dielectric is deposited over the channel material, and is shown as layer 222 in the figure. Gate electrode material is then deposited over the dielectric as described above, and is shown as layer 224 in the figure.

A mask layer is formed and patterned and the etch step to form the patterned gate electrodes and dielectrics is again performed as above. The etch used is highly selective to the trench oxide over the channel material and so the amount of oxide removed in the sidewall areas of the STI areas is much greater than the amount of channel material removed in the other areas. Typically the etchant used is 3 times or more selective for the trench oxide than for the channel material.

Sidewall spacers 228 are formed at the side of the gate electrode and gate dielectric materials by CVD; these sidewalls are a low-k material such as an oxide, a nitride, or a nitrogen-containing oxide. The preferred material for the sidewalls is CVD nitride.

After the sidewall spacers 228 are formed a second etch may be performed to remove all remaining channel material from the substrate, this step is optional. Salicide areas 230 may be formed over the gate electrodes 224 by depositing a metal on the gate electrodes and treating it to form a salicide, cobalt or titanium may be used. Source and drain regions 240, 242 are formed in the p-well regions 205 using an n-type dopant and anneal, similarly source and drain regions 244 and 246 are formed in the n-wells 203 by implant and anneal, the dopants will be p-type for these diffusion areas.

The cross section of FIG. 12 depicts a single n-type MOS device 213 having a source and drain diffused region in the substrate of n-type dopants in a p-type well, with a counter-doped channel material 214, an interfacial layer 220, a layer of high-k gate dielectric 222, a gate electrode material and an optional salicide layer over the gate electrode. Similarly a single p-type MOS device 209 is shown in FIG. 12 having source and drain diffusions 244, 246 of a p-type in the n-well 203, a doped channel material 210, an interfacial layer oxide, a high-k gate dielectric, a gate electrode and an optional salicide layer over the gate electrode. All of the sidewalls of the active devices over the substrate, and the gate electrodes formed over the STI regions, are shown with sidewalls extending beneath the layer of high-k gate dielectric. The sidewalls may extend through the channel layer as shown in the figure, or into the channel layer, but in any case the etch will expose at least a portion of the channel layer and the STI layer beneath the bottom depth of the high-k gate dielectric. Of course a practical device may have many p and n MOS transistors formed as shown in FIG. 12.

Following the source and drain formation of the devices in FIG. 12, conventional processing including a passivation layer, interlevel oxide growth, contact patterning, via and metallization layer formation will be performed to provide connecting polysilicon or metal conductive layers to allow for connecting the p and n-type transistors to form circuitry.

Figure 13:
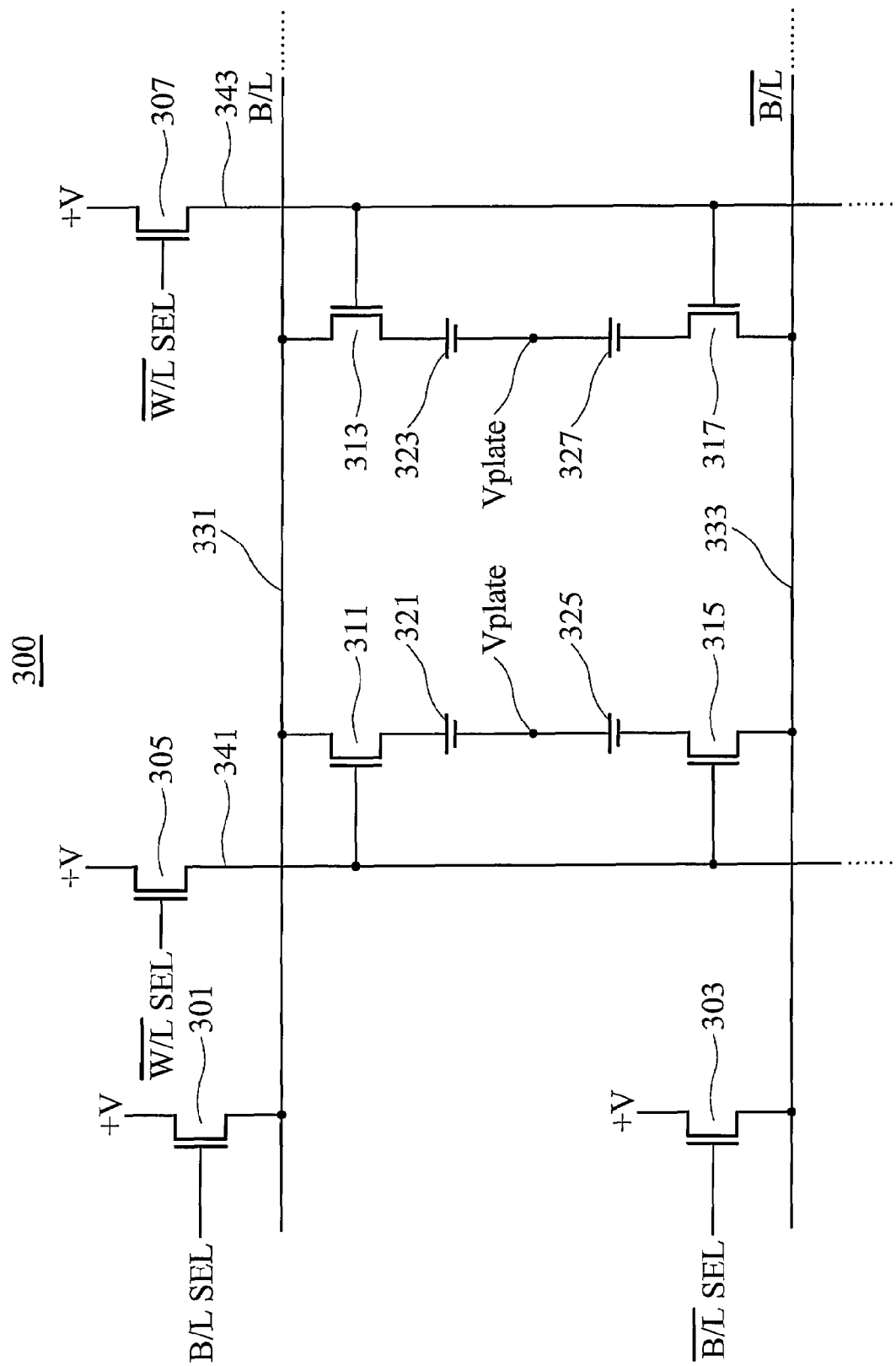
FIG. 13 is a portion of a schematic of a memory circuit of another embodiment of the invention.

FIG. 13 depicts a circuit diagram for another preferred embodiment using the novel process and structure of the invention. In FIG. 13, a section of a memory array is depicted at the intersection of a pair of bit line pair conductors 331, 333, labeled B/L and B/L_, and a pair of word line conductors 341, 343 labeled W/L and W/L_. The core area is shown having for example, capacitor storage elements 321, 323, 325 and 327 each coupled to an access transistor at a drain terminal, the corresponding transistors are 311, 313, 315 and 317. The storage capacitors are further each coupled to a fixed potential Vplate, which may be provided by an on-chip generator or supplied externally. Each access transistor is coupled to a word line at its gate terminal and a bit line at its source terminal. In operation, when the corresponding word line has a voltage placed on it by a word line select transistor 305 or 307, it makes the transistors coupled to that word line available for access depending on whether the corresponding bit line select transistor 301 or 303 has coupled a voltage onto the bit line, thus the four lines shown can select one of the four transistors, or more than one, depending on the voltages at any given time.

In laying out the circuit of FIG. 13 as a physical structure, it is important to consider that there are many access transistor-capacitor pairs (storage cells) coupled to each bit line and word line in the array. The access transistors need to be as small as the particular process will allow and still have good performance, fast turn on and turn off, and a low threshold voltage are important; the transistors that are "peripheral" circuitry, for example the bit line and word line select transistors, need to be larger as they have a substantial capacitive loading to drive; however there are fewer of them so increased area for these devices is acceptable.

Figure 14:
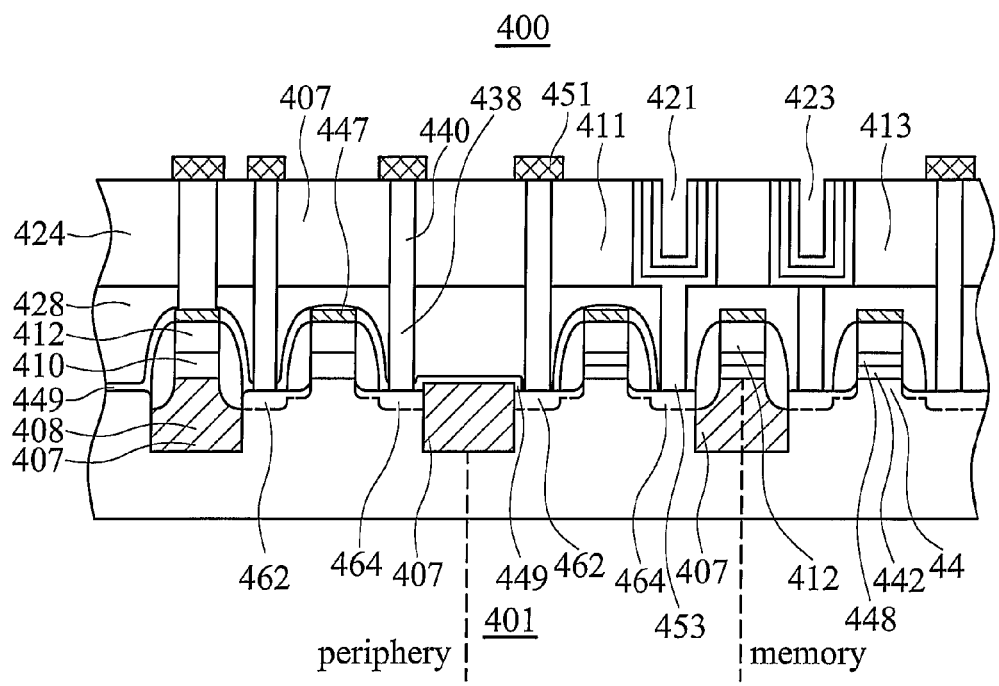
FIG. 14 is a cross sectional view of a completed memory cell and peripheral circuit of the embodiment of FIG. 13.

FIG. 14 depicts a cross sectional view of a memory cell and a peripheral transistor associated with the memory cell, the high-k gate dielectric of the invention. Device 400 is depicted on a portion of substrate 401, which is divided into a memory region and a periphery region. Three planar transistors are shown, 407 is in the periphery region which may, for example, be one of the select transistors such as 301, 303, 305, 307 in the previous figure, and access transistors 411 and 413 in the memory region are shown. Capacitors 421 and 423 are shown coupled to the drain regions 464 of access transistors 411 and 413, respectively. The capacitors are crown shaped capacitors formed over the cells in the interlevel insulation, for example the capacitors could be MIM capacitors as is known in the art.

Transistors 411, 413 are formed using the strained channel and optionally the counter-doping process of the invention as described above, layer 442 is a strained Si or SiGe channel, layer 444 is a silicon cap layer which is processed as a sacrificial layer to form a silicon oxide interfacial layer, layer 448 is a high-k dielectric layer deposited to a certain thickness, and layer 412 is the gate electrode layer, which is protected by sidewalls 420, a low-k dielectric sidewall material.

The transistor 407 does not have the channel material, because it is a larger scale transistor with greater dielectric thickness and the channel material is not required to enhance its performance. High-k gate dielectric 448 is deposited in the periphery region to a greater thickness than for the memory area; and gate electrode 412 is again deposited over the dielectric to complete the insulated gate. Salicide layer 447 is shown formed on the gate electrodes in both regions, as is protective layer 449, a thin insulator, typically an oxide. Interlevel insulator layers 428 and 424 are formed above the substrate in both regions, and via stacks 430 and 440 are formed in contacts patterned within these layers to couple the source, drain regions to the metallization layer 451, which may be aluminum or copper metallization. Vias 453 are used to couple the access transistor drain regions to the first electrode of the capacitors, as is known in the art. The gate electrodes of access transistors 411 and 413 are part of word line conductors for selecting those cells as shown in FIG. 13.

Fabrication of the memory device 400 using the process of the invention is as follows. The substrate is provided and n and p-type wells may be formed, if desired, using conventional ion implantation and anneal. Alternatively these well regions may be formed later in the processing by through layer ion implantation and anneal steps. The shallow trench isolation regions are fabricated using a mask, pattern and etch process as is described above, high density or other insulator 408 is formed and a CMP process is again used to planarize the STI regions and the surrounding substrate. Protective masking is used to isolate the memory area from the periphery area by forming a coating over the periphery, and the strained channel material 442 is provided by an epitaxial growth, preferably a doped SiGe layer is grown. A sacrificial silicon cap layer 444 may be grown or deposited to control the native oxide layer that will form on the channel layer; this oxide is a thin interfacial layer as described above. The periphery region is now unmasked and the processing continues.

The high-k gate dielectric material 410 is deposited over the substrate. Because the periphery did not receive the channel material, there is a slight step height up from the periphery to the memory cell area. This may be addressed later by a planarization step as is known in the art.

Gate electrode material 412 is deposited or grown over the high-k gate dielectric material. This layer is then patterned with an etch mask material and an anisotropic etch is performed to form the sidewalls of the gate electrodes as shown in FIG. 14. The etch process is allowed to continue, removing a portion of the channel material or the substrate and removing a portion of the oxide of the STI trenches, as before. This process allows the deeper sidewall material (subsequently formed) to protect the strained channel material and to prevent impurities from entering the dielectric and the interfaces with the dielectric. Impurities that enter the strained channel material may form compounds, such as oxides, that relax the material and thereby reduce its effectiveness.

Sidewall insulator 420 is formed on the sidewalls of the gate electrodes. Again this insulator extends below the bottom of the high-k gate dielectric layer. Salicide layer 447 is formed on the top of the gate electrodes, if this optional material is used. Source and drain regions 462, 464 are formed using conventional ion implant and thermal anneal steps.

A protective insulator 449, typically oxide or nitride, is provided over the completed transistors in both areas of the substrate. Interlevel insulator layers 428 and then 424 are formed over the substrate. Contact areas are patterned and etched to provide connectivity to the source and drain regions, and to couple the capacitor bottom plates to the access transistor drain regions. Via material is used to fill the contact recesses with a conductive material or conductive plugs are formed as is known in the art.

The storage capacitors are formed by depositing a metal or polysilicon; preferably an HSG polysilicon material is formed as the bottom electrode. The capacitor dielectric, which may also be a high-k material or may be conventional silicon dioxide, silicon nitride or other dielectric is formed over the bottom plate in the storage capacitors. The top plate is formed which is also polysilicon or a metal or metal compound such as TiN. Finally, the memory device is completed with one or several metallization layer such as layer 451 which are coupled to the gate, drain and source regions, and to the top plate of the capacitors, as necessary to allow connection of the devices to complete the circuits. Aluminum or copper metallization may be used, damascene or dual damascene processes may be used, or conventional deposit, pattern and etch steps may be used instead to form metallization layer 451.

Figure 15:
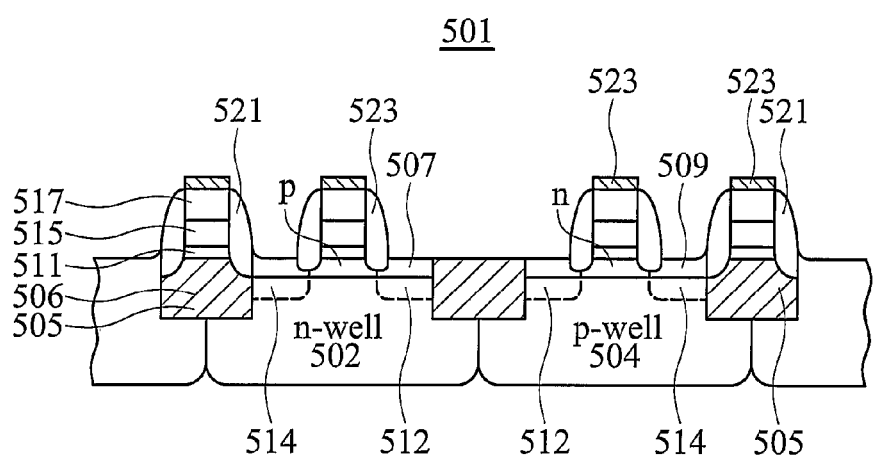
FIG. 15 is a cross sectional view of a completed embodiment using counter-doped channel material that is ion implanted to form a counter-doped channel in the substrate in wells or in the substrate itself.

FIG. 15 depicts an alternative embodiment of the invention. In FIG. 15, the channel is formed by implanting ions into the substrate, instead of a deposited material. The channel is counter-doped to the surrounding substrate, so that it may be doped n (or p) type in p (or n) type substrate or well materials to form transistors as is known in the art. Wells may be used as in FIG. 12 above and the substrate may be a layer of silicon on insulator (SOI) as is known in the art.

In FIG. 15, substrate 501 is shown with shallow isolation regions 505 formed and filled with HDP oxide 506, as before. Preferably, wells 502 and 504 are formed using implant and anneal steps as known in the art for well formation. Channel regions 507, 509 are formed by ion implantation as is known in the art using a dopant that creates a counter-doped channel to the substrate conductivity type or, as shown here, the wells 502 and 504. The interfacial layer 511 is formed as a thin nitride or oxide as before, high-k gate dielectric layer 515 is deposited, gate conductor 517 is deposited, the layers are patterned to form stacks over the substrate and the shallow trench isolation regions, source and drain regions are implanted and annealed to form source and drains 514, 512, and sidewalls 521 are grown using low-k oxides, nitrides or other insulators as before. When the substrate and shallow trench isolation regions are patterned using the etch steps described above, again the etch is allowed to proceed to a depth below the bottom of the interfacial layer and the dielectric layer, and the etch preferably etches the STI regions to a depth greater than the substrate etch depth by a ratio of greater than 3. The sidewall material therefore protects the high-k gate dielectric material from the intrusion of undesired contaminants and thereby improves the performance of the active devices formed in the n and p well regions.

The embodiments of the invention described above are exemplary and not limiting, and variations that are apparent to those skilled in the art that include the features of the invention are within the scope of the invention and the appended claims.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a semiconductor substrate;
shallow trench isolation regions formed in the substrate to define active device regions between the isolation regions;
a counter-doping channel region formed overlying at least one of the active areas, wherein the counter-doping channel region is doped differently from the semiconductor substrate;
at least one gate dielectric region of high-k material formed over the substrate, and having a top surface and sidewalls;
at least one region of conductive gate electrode material formed over the top surface of the gate dielectric region and having sidewalls coextensive with the sidewalls of the gate dielectric region; and
sidewall spacers formed over the gate electrode sidewalls and the gate dielectric sidewalls extending below the bottom layer of the gate dielectric region.

2. The semiconductor device according to claim 1, wherein the high-k material comprises a material having a dielectric constant greater than 8.

3. The semiconductor device according to claim 1, wherein the gate dielectric region comprises a material having amorphous structure.

4. The semiconductor device of claim 1, wherein the high-k material comprises a material selected from the group of: tantalum, lanthanum, hafnium, aluminum, and combinations thereof.

5. The semiconductor device of claim 4, wherein the high-k material comprises a material selected from the group of $HfO_x$, $HfSiO_x$, and $HfSiO_xN_y$ and combinations thereof.

6. The semiconductor device of claim 1, wherein the high-k material comprises a material selected from the group of $AlO_x$, $LaO_x$, $HfAlO_x$, and combinations thereof.

7. The semiconductor device of claim 1, wherein the conductive gate electrode comprises a material selected from the group of silicon, germanium, polysilicon, metal silicide metal and combinations thereof.

8. The semiconductor device according to claim 5, wherein the counter-doping channel includes at least one dopant of a conductivity type different from the conductivity type of the substrate.

9. The semiconductor device according to claim 8, wherein the counter-doping channel comprises a material selected from the group of silicon, germanium, strained silicon, strained germanium, strained silicon germanium, and combinations thereof.

10. The semiconductor device according to claim 1, wherein the counter-doping channel comprises a strained SiGe channel material.

11. The semiconductor device according to claim 10, wherein the strained SiGe channel material includes a boron dopant counter-doping.

12. The semiconductor device according to claim 1, wherein:
the sidewall spacer formed on the sidewalls of the gate electrode regions and gate dielectric regions formed over the shallow trench isolation regions extend into the shallow trench isolation regions by a depth which is a first depth;
the sidewall spacer regions formed on the sidewalls of the gate electrode regions and high-k gate dielectric regions formed over the counter-doping channel in regions other than the shallow trench isolation regions extend into the counter-doping channel region by a depth that is a second depth; wherein the first depth is different from the second depth.

13. The semiconductor device according to claim 12, wherein the ratio of the first depth to the second depth is at least 3 or greater.

14. A semiconductor integrated circuit, comprising:
a semiconductor substrate;
a core region defined in the semiconductor substrate;
a peripheral region defined in the semiconductor substrate;
a first active device formed over the substrate in the core region, comprising a counter-doping channel formed on the substrate, a high-k gate dielectric formed over the substrate, and a gate conductor formed over the high-k gate dielectric;
one or more shallow trench isolation regions formed in the core region, the high-k gate dielectric and the gate conductor overlying at least one of the shallow trench isolation regions;
a second active device formed in the peripheral region and having a high-k gate dielectric and a gate conductor formed over the substrate; and
sidewalls formed over the first active device, the at least one of the shallow trench isolation regions, and the second active device, the sidewalls extending to a depth beneath the bottom of the high-k gate dielectric of the first active device, the second active device, and the at least one of the shallow trench isolation regions, respectfully.

15. The semiconductor device according to claim 14, wherein the high-k gate dielectric comprises a material having amorphous structure.

16. The semiconductor device of claim 14, wherein the high-k gate dielectric comprises a material selected from the group of $HfO_x$, $HfSiO_x$ and $HfSiO_xN_y$, and combinations thereof.

17. The semiconductor device of claim 14 wherein the high-k gate dielectric comprises a material selected from the group of $AlO_x$, $LaO_x$, $HfAlO_x$, and combinations thereof.

18. The semiconductor device according to claim 14, wherein the counter-doping channel region comprises a strained SiGe channel material.

19. A method for forming a semiconductor device, comprising:
forming shallow trench isolation regions into a semiconductor substrate;
providing insulator material in the shallow trench isolation regions;
forming a counter-doping channel over the semiconductor substrate;
depositing a high-k gate dielectric material over the semiconductor substrate;
depositing a gate electrode material over the high-k gate dielectric material;
patterning the gate electrode material to define at least one high-k gate dielectric material, insulated gate area over the semiconductor substrate;
etching the gate electrode material, the high-k gate dielectric, counter-doping channel and the semiconductor substrate to form sidewalls of the at least one insulated gate area, the sidewalls extending into the semiconductor substrate;
forming sidewall insulators on the at least one insulated gate area, the sidewall insulators extending into the semiconductor substrate to a depth beneath the bottom of the high-k gate dielectric material.

20. The method of claim 19 and further comprising the steps of:
patterning to define at least one insulated gate electrode over a shallow trench isolation region in the substrate;
contemporaneously with etching the gate electrode material, the high-k gate dielectric, and the semiconductor substrate, also etching the shallow trench isolation regions to form sidewalls of the at least one insulated gate area over the shallow trench isolation region, the sidewalls extending into the shallow trench isolation region;
forming sidewall insulators on the at least one insulated gate area, the sidewall insulators extending into the shallow trench isolation region to a depth beneath the bottom of the high-k gate dielectric which depth is greater than the depth that the sidewalls extend into the semiconductor substrate.

* * * * *

UNITED STATES PATENT AND TRADEMARK OFFICE
CERTIFICATE OF CORRECTION

PATENT NO. : 7,332,407 B2  Page 1 of 1
APPLICATION NO. : 11/788229
DATED : February 19, 2008
INVENTOR(S) : Wang et al.

It is certified that error appears in the above-identified patent and that said Letters Patent is hereby corrected as shown below:

On the Title Page, Section (56) References Cited, U.S. PATENT DOCUMENTS, Page 2, column 1, $5^{th}$ entry, delete "Lin" and insert --Liu--.
In Col. 1, line 37, after that, insert --of--.
In Col. 7, line 6, delete "overly" and insert --overlie--.
In Col. 8, line 19, delete "insulators." and insert --insulators--.
In Col. 9, line 67, before are, insert --that--.
In Col. 12, line 4, delete "444" and insert --44--.
In Col. 12, line 44, delete "444" and insert --44--.
In Col. 13, line 25, delete "layer" and insert --layers--.

Signed and Sealed this

Twenty-fourth Day of June, 2008

JON W. DUDAS
*Director of the United States Patent and Trademark Office*